United States Patent
Fan et al.

(10) Patent No.: US 12,532,424 B2
(45) Date of Patent: Jan. 20, 2026

(54) LOCKING MECHANISM FOR REMOVABLY LOCKING AN EXPANSION ELECTRICAL COMPONENT TO A MAIN ELECTRICAL COMPONENT OF AN ELECTRONIC DEVICE AND THE ELECTRONIC DEVICE

(71) Applicant: Jabil Circuit (Singapore) Pte. Ltd., Singapore (SG)

(72) Inventors: Chen-Lu Fan, Taichung (TW);
Yu-Ming Lin, Taichung (TW);
Chen-Hsuan Hsu, Taichung (TW);
Wen-Chieh Liao, Taichung (TW);
Kuo-Hsing Yang, Taichung (TW)

(73) Assignee: Jabil Circuit (Singapore) Pte. Ltd., Republic of (SG)

( * ) Notice: Subject to any disclaimer, the term of this patent is extended or adjusted under 35 U.S.C. 154(b) by 139 days.

(21) Appl. No.: 18/598,287

(22) Filed: Mar. 7, 2024

(65) Prior Publication Data

US 2024/0373572 A1   Nov. 7, 2024

(30) Foreign Application Priority Data

May 5, 2023   (CN) .......................... 202321074397.X

(51) Int. Cl.
*H05K 5/02* (2006.01)

(52) U.S. Cl.
CPC ......... *H05K 5/0221* (2013.01); *H05K 5/0286* (2013.01)

(58) Field of Classification Search
None
See application file for complete search history.

(56) References Cited

U.S. PATENT DOCUMENTS

| 6,679,646 B2 * | 1/2004 | Quardt | H05K 5/30 403/348 |
| 6,726,505 B2 * | 4/2004 | Cermak, III | G06F 1/184 174/138 D |
| 7,085,141 B2 * | 8/2006 | Yi | H05K 7/142 29/830 |

(Continued)

FOREIGN PATENT DOCUMENTS

CN   214800348 U   11/2021

*Primary Examiner* — Xanthia C Relford
(74) *Attorney, Agent, or Firm* — Young Basile Hanlon & MacFarlane, P.C.

(57) ABSTRACT

A locking mechanism for removably locking a first electrical component to a second electrical component includes a positioning post secured to the second electrical component, a frame for mounting the first electrical component, and a locking member movably connected with the frame. The positioning post has a head and a neck. The locking member has a snap fastening portion, a flexible portion and an unlocking operated portion. When the snap fastening portion contacts the head and is moved toward the neck, a lateral thrust force exerted by the head spreads the snap fastening portion and cause deformation of the flexible portion to store a biasing restoring force. When the snap fastening portion is aligned with the neck, the snap fastening portion is moved by the biasing restoring force to be snap fastened to the neck. The unlocking operated portion is operated to disengage the snap fastening portion from the neck.

19 Claims, 15 Drawing Sheets

(56) References Cited

U.S. PATENT DOCUMENTS

| | | | | |
|---|---|---|---|---|
| 7,300,299 | B2* | 11/2007 | Wang | H05K 7/142 |
| | | | | 439/326 |
| 7,391,619 | B1* | 6/2008 | Lee | H05K 7/1417 |
| | | | | 361/740 |
| 7,583,517 | B2* | 9/2009 | Hartman | H05K 7/142 |
| | | | | 361/810 |
| 8,325,493 | B2* | 12/2012 | McClellan | H01R 12/7064 |
| | | | | 361/801 |
| 8,472,210 | B2* | 6/2013 | Chiu | G06F 1/186 |
| | | | | 361/752 |
| 8,848,349 | B2* | 9/2014 | Ke | H05K 5/02 |
| | | | | 361/679.01 |
| 9,098,252 | B2* | 8/2015 | Sauer | H05K 7/1429 |
| 10,185,374 | B2* | 1/2019 | Yang | G06F 1/187 |
| 10,234,913 | B1* | 3/2019 | Kho | H05K 3/36 |
| 11,991,850 | B2* | 5/2024 | Hung | H05K 7/1417 |
| 12,016,148 | B2* | 6/2024 | Tsorng | H05K 7/1487 |
| 2007/0211424 | A1* | 9/2007 | Liu | G06F 1/187 |
| | | | | 361/679.33 |
| 2009/0080171 | A1* | 3/2009 | Peng | H05K 7/142 |
| | | | | 361/807 |
| 2014/0183317 | A1* | 7/2014 | Li | G06F 1/186 |
| | | | | 248/316.7 |
| 2017/0332512 | A1* | 11/2017 | Potter | H05K 7/1402 |
| 2019/0182977 | A1* | 6/2019 | Lee | G11B 33/00 |
| 2021/0064102 | A1* | 3/2021 | Tseng | F16B 2/22 |
| 2022/0272859 | A1* | 8/2022 | Zhang | H05K 1/141 |
| 2023/0397358 | A1* | 12/2023 | Homann | H05K 3/325 |

* cited by examiner

LOCKING MECHANISM FOR REMOVABLY LOCKING AN EXPANSION ELECTRICAL COMPONENT TO A MAIN ELECTRICAL COMPONENT OF AN ELECTRONIC DEVICE AND THE ELECTRONIC DEVICE

CROSS-REFERENCE TO RELATED APPLICATION

This application claims priority to Chinese Patent Application No. 202321074397.X, filed on May 5, 2023, and incorporated by reference herein in its entirety.

FIELD

The disclosure relates to a locking mechanism for an electronic device, and more particularly to a locking mechanism for removably locking electrical components of the electronic device.

BACKGROUND

An expansion card module of an electronic device is locked onto a main board through a locking mechanism to retain the expansion card in the main board. The conventional locking mechanism has a large number of components, which is inconvenient to assemble and bulky, occupies too much space, and has high manufacturing costs. Moreover, during the operation of locking and unlocking the locking mechanism, many operating steps need be performed so as to result in inconvenience, low efficiency and time-consuming operation.

SUMMARY

Therefore, an object of the disclosure is to provide a locking mechanism that can alleviate at least one of the drawbacks of the prior art.

According to the disclosure, the locking mechanism for removably locking a first electrical component to a second electrical component includes a positioning post, a frame for the first electrical component to be disposed thereon, and a locking member movably connected with the frame. The positioning post has a mounting end securely mountable on the second electrical component, a head opposite to the mounting end, and a neck between the mounting end and the head and connected with the head. The locking member has a snap fastening portion and a flexible portion opposite to each other, and an unlocking operated portion. The snap fastening portion is configured such that, when the snap fastening portion contacts the head and is moved toward the neck, a lateral thrust force exerted by the head deformably spreads the snap fastening portion, which results in deformation of the flexible portion to store a biasing restoring force. The flexible portion is configured such that, when the snap fastening portion is moved to align with the neck, the snap fastening portion is moved by the biasing restoring force to be snap fastened to the neck. The unlocking operated portion is operated to disengage the snap fastening portion from the neck.

Another object of the disclosure is to provide an electronic device that can alleviate at least one of the drawbacks of the prior art.

According to the disclosure, the electronic device includes a first electrical component, a second electrical component, and a locking mechanism as described above.

BRIEF DESCRIPTION OF THE DRAWINGS

Other features and advantages of the disclosure will become apparent in the following detailed description of the embodiment with reference to the accompanying drawings. It is noted that various features may not be drawn to scale.

DETAILED DESCRIPTION

Figure 1:
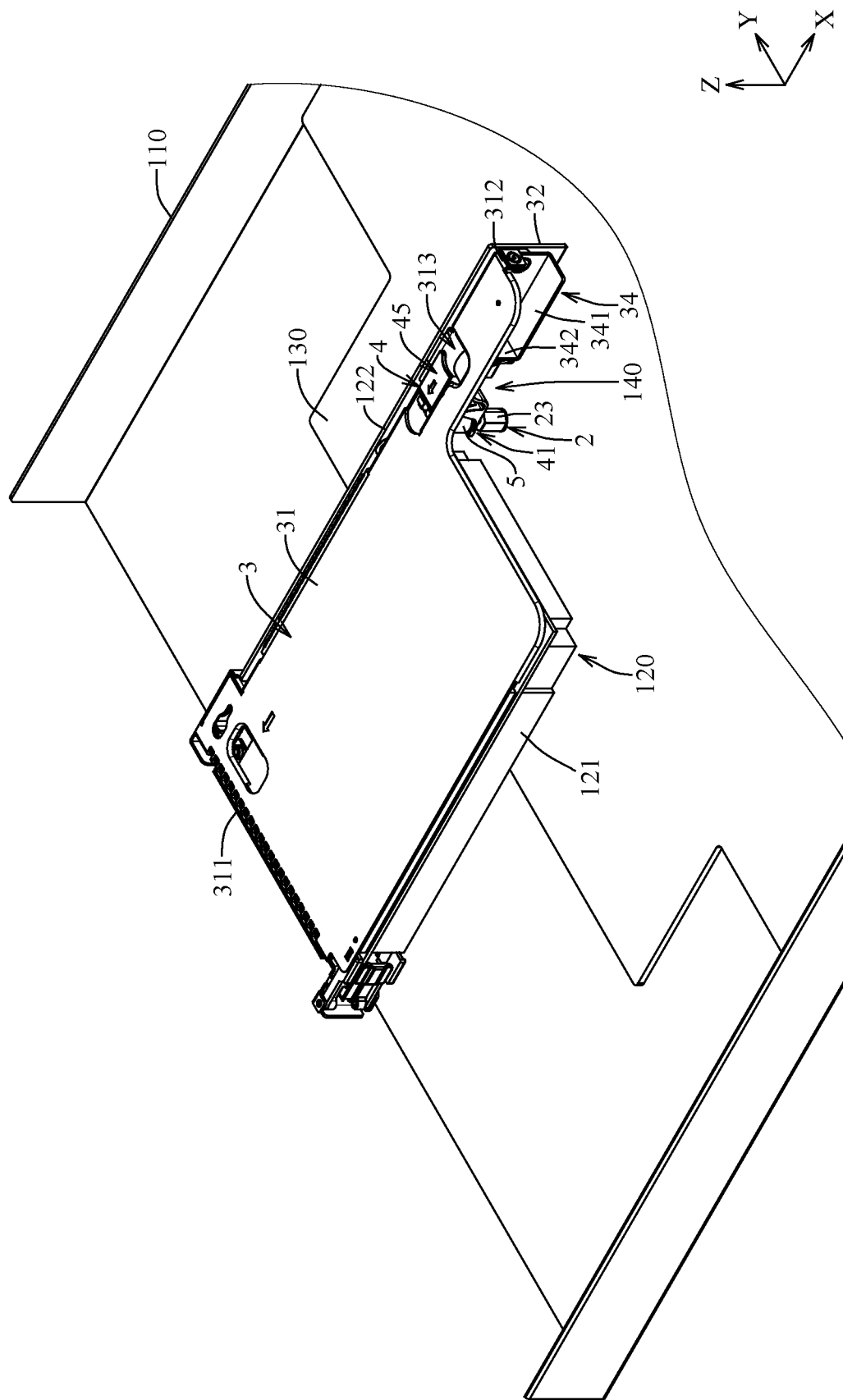
FIG. 1 is a fragmentary perspective view illustrating an embodiment of an electronic device according to the disclosure.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
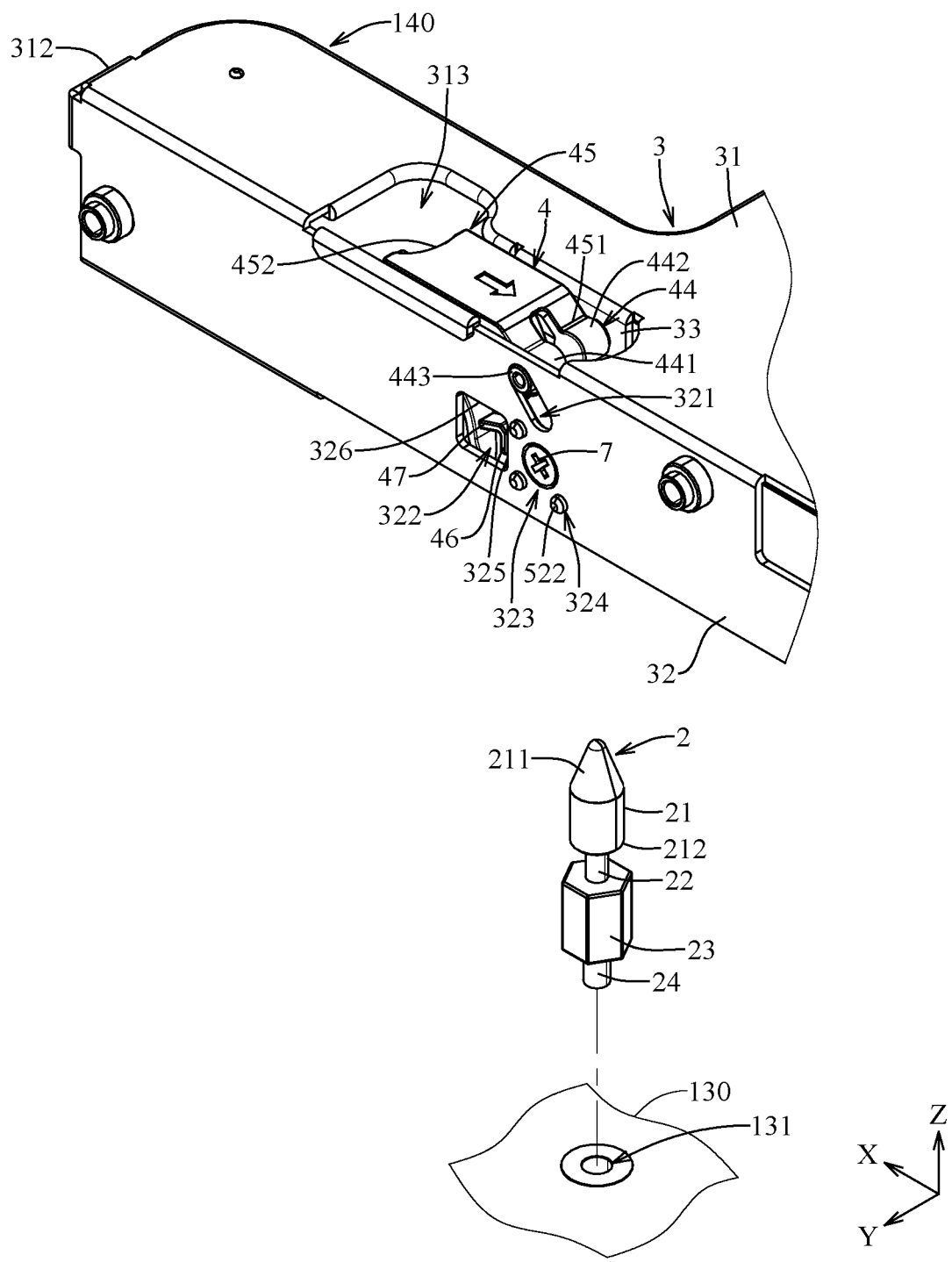
FIG. 2 is a fragmentary exploded perspective view illustrating an embodiment of a locking mechanism and a second electrical component according to the disclosure.
Figure 3:
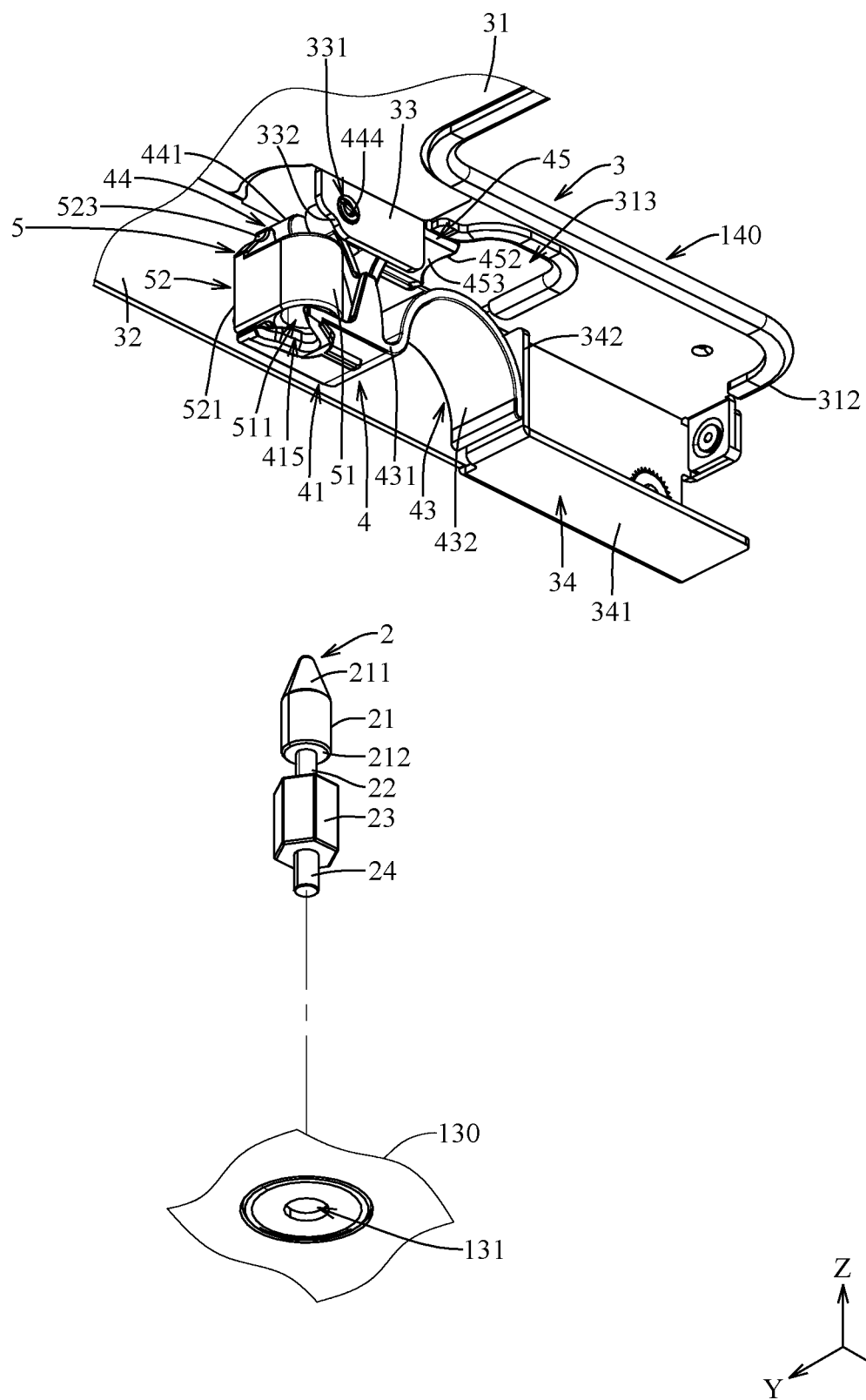
FIG. 3 is a fragmentary exploded perspective view similar to FIG. 2 but taken from another angle.

Referring to FIGS. 1 and 2, an embodiment of an electronic device 100 according to the disclosure includes a housing 110, a first electrical component 120, a second electrical component 130 and a locking mechanism 140. In this embodiment, the electronic device 100 may be, but is not limited to, a server, a computer or a storage device. The first electrical component 120 includes an expansion card 121, such as a PCI Express expansion card, and a circuit board 122 electronically connected with a side of the expansion card 121. The second electrical component 130 is a main board disposed within the housing 110. The second electrical component 130 includes an electrical connector (not shown) to be connected with the circuit board 122 of the first electrical component 120. The second electrical component 130 has a mounting hole 131. The locking mechanism 140 is for removably locking the first electrical component 120 to the second electrical component 130.

A first horizontal direction (X), a second horizontal direction (Y) perpendicular to the first horizontal direction (X), and a vertical direction (Z) perpendicular to both the first horizontal direction (X) and the second horizontal direction (Y) of the electronic device 100 are defined for facilitating the following description. For example, the first horizontal direction (X) is a front-rear direction, the second horizontal direction (Y) is a left-right direction, and the vertical direction (Z) is an up-down direction.

With reference to FIGS. 1, 2, 3 and 4, the locking mechanism 140 includes a positioning post 2, a frame 3, a locking member 4, a sleeve 5, a first screw 6 and a second screw 7. The positioning post 2 has a mounting end 24 which is securely mounted on the second electrical component 130, a head 21 opposite to the mounting end 24, a neck 22 between the mounting end 24 and the head 21 and connected with the head 21, and an abutting portion 23 between the neck 22 and the mounting end 24. The head 21 is in the form of a cylinder and has an outer taper end surface 211 which is tapered upwardly, and an annular lower surface 212 opposite to the outer taper end surface 211 and facing downwardly. The neck 22 is in the form of a cylinder, and has an outer diameter smaller than that of the head 21. The abutting portion 23 is in the form of a prism, and has an outer diameter larger than that of the neck 22. The abutting portion 23 abuts against a top surface of the second electrical component 130. The mounting end 24 is in the form of a cylinder and has an outer diameter smaller than that of the abutting portion 23. The mounting end 24 is securely mounted in the mounting hole 131 of the second electrical component 130. In this embodiment, the mounting hole 131 is a screw hole, and the mounting end 24 is a screw bolt threadedly engaged with the mounting hole 131. Alternatively, the mounting hole 131 may be a weld access hole, and the mounting end 24 is a weld leg secured in the mounting hole 131 via welding.

With reference to FIGS. 1, 4, 5 and 6, the frame 3 is elongated in the first horizontal direction (X) for the first electrical component 120 to be disposed thereon. The frame 3 has a top wall plate 31, an outboard wall plate 32 connected with a left side of the top wall plate 31, an inboard wall plate 33 connected with the top wall plate 31 and disposed inboard of the outboard wall plate 32, and an abutting wall plate 34 connected with a lower end of the outboard wall plate 32 and disposed forwardly of the inboard wall plate 33. The expansion card 121 is disposed under the top wall plate 31. The top wall plate 31 has a rear end 311 and a front end 312 opposite to each other in the first horizontal direction (X), and a window 313 formed adjacent to the front end 312 and interposed between the outboard wall plate 32 and the inboard wall plate 33.

With reference to FIGS. 1 to 5, the circuit board 122 of the first electrical component 120 is disposed on an outside surface of the outboard wall plate 32. The outboard wall plate 32 is formed with an outboard pivot hole 321 near the window 313, an abutting hole 322 forwardly and downwardly of the outboard pivot hole 321, a through hole 323 rearwardly of the abutting hole 322, and a plurality of positioning holes 324 arranged around the through hole 323. Specifically, the outboard pivot hole 321 is in the form of an elongated inclined hole which is inclined upwardly and forwardly. The abutting hole 322 is a square hole near the bottom end of the outboard wall plate 32 and bordered by a first abutting edge 325 at a rear end, and a second abutting edge 326 at an upper end. The inboard wall plate 33 is formed with an inboard pivot hole 331 aligned with the outboard pivot hole 321 in the second horizontal direction (Y). The inboard pivot hole 331 is a round hole. The inboard wall plate 33 has a chamfer 332 formed near the inboard pivot hole 331. The abutting wall plate 34 has a connecting plate portion 341 connected with the bottom end of the outboard wall plate 32, and an upright plate portion 342 connected with a rear end of the connecting plate portion 341.

The locking member 4 is movably connected with the frame 3 to be removably retained on the positioning post 2 so as to removably lock the first electrical component 120 (see FIG. 1) to the second electrical component 130 (see FIG. 1). In this embodiment, the locking member 4 is integrally formed as a single piece. Specifically, the locking member 4 is made from a plastic material by injection molding to be a single piece so as to simplify the manufacturing process and reduce manufacturing costs and the amount of component parts of the locking mechanism 140.

The locking member 4 has a snap fastening portion 41, a flexible portion 43, a pivot portion 44, an unlocking operated portion 45, a first retaining protrusion 46 and a second retaining protrusion 47. The snap fastening portion 41 and the flexible portion 43 are disposed opposite to each other in the first horizontal direction (X) to be at a rear side and a front side, respectively. The snap fastening portion 41 is configured such that, when the snap fastening portion 41 contacts the head 21 of the positioning post 2 and is moved toward the neck 22 in the vertical direction (Z), a lateral thrust force exerted by the head deformably spreads the snap fastening portion 41. This results in deformation of the flexible portion 43 which stores a biasing restoring force. The snap fastening portion 41 has a snap fastening section 411 to be retained on the neck 22 of the positioning post 2, and a connecting section 412 connected with an upper portion of the snap fastening section 411. The snap fastening section 411 has a rear end edge 413 and a back end 414 opposite to the rear end edge 413. The snap fastening section 411 is formed with a fastening notch 415 extending from the rear end edge 413 toward the back end 414 to be retained on the neck 22. The snap fastening section 411 further has a flat upper surface 416 which is interposed between the back end 414 and the fastening notch 415, and a peripheral slope surface 417 which extends around the fastening notch 415 and which extends and is inclined downwardly from the flat upper surface 416 toward the back end 414. The peripheral slope surface 417 has two junction lines 418 which are connected with the flat upper surface 416 and located at two opposite sides of the fastening notch 415, respectively, in the second horizontal direction (Y). The peripheral slope surface 417 is to be in surface contact engagement with the annular lower surface 212 of the head 21. The two junction lines 418 are parallel to the second horizontal direction (Y) and aligned with each other in the second horizontal direction (Y). Specifically, the flat upper surface 416 of the snap fastening section 411 has a semicircular shaped inclined recess 419 which is recessed from the flat upper surface 416 and inclined downwardly toward the back end 414 and in communication with the fastening notch 415 for accommodating a portion of a lower end of the head 21. The peripheral slope surface 417 is of a semicircular shape and borders a bottom of the semicircular shaped inclined recess 419.

The connecting section 412 has a connecting bracket 420 connected with an upper portion of the snap fastening section 411, a support arm 421 extending and inclined upwardly and rearwardly from the connecting bracket 420, a deformable arm 422 extending and inclined upwardly and rearwardly from the connecting bracket 420 and disposed inboard of the support arm 421, and a reinforcing rib 423 connected with back portions of the connecting bracket 420 and the support arm 421.

The flexible portion 43 is configured such that, when the snap fastening portion 41 is moved to align with the neck 22 of the positioning post 2, the snap fastening portion 41 is moved by the biasing restoring force to be snap fastened to the neck 22. In this embodiment, the flexible portion 43 is integrally formed and connected with the back end 414 of the snap fastening section 411. Specifically, the flexible portion 43 has a connecting arm 431 which extends arcuately and upwardly from the back end 414, and a flexible arm 432 which is connected with and extends from the connecting arm 431 away from the back end 414 to terminate at a free end for abutting against the upright plate portion 342 of the abutting wall plate 34.

Figure 9:
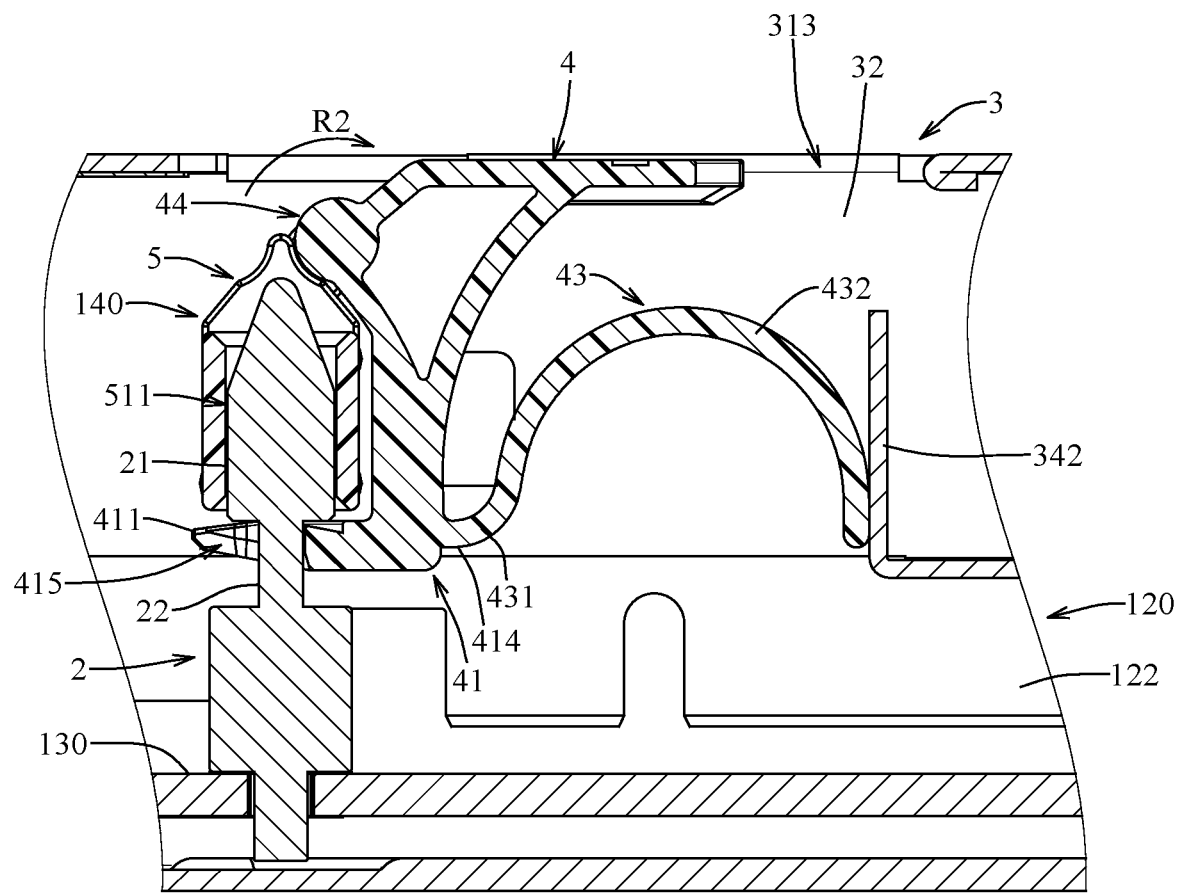
FIG. 9 is a fragmentary sectional view illustrating a locking member of the locking mechanism in a locking position.
Figure 11:
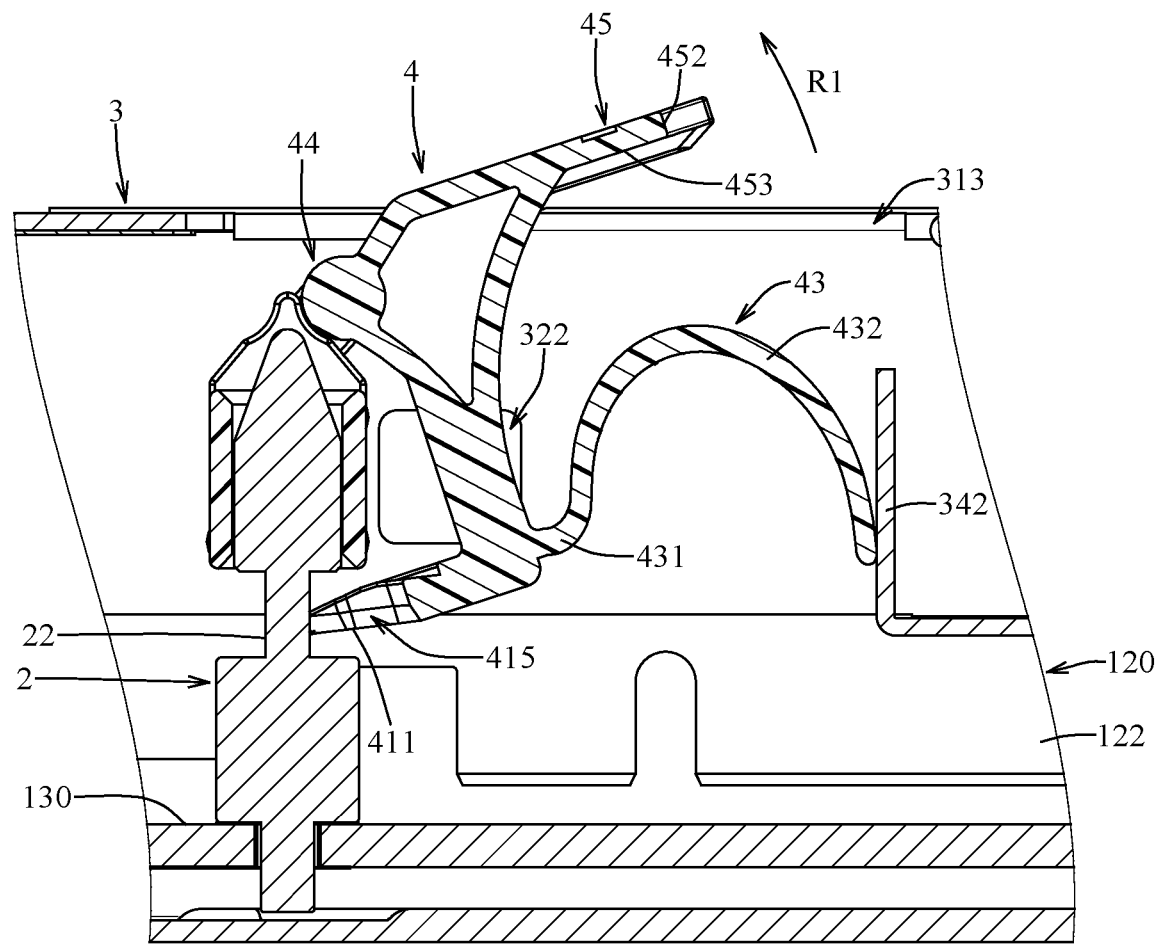
FIG. 11 is a fragmentary sectional view illustrating the locking mechanism during disassembling and the locking member in an unlocking position.

With reference to FIGS. 4 to 7, the pivot portion 44 has an outboard axle 441 which is connected with an upper portion of the support arm 421 of the snap fastening portion 41, and an inboard axle 442 which is connected with an upper end (a distal end) of the deformable arm 422 and disposed inboard of the outboard axle 441. The outboard axle 441 and the inboard axle 442 are located above the snap fastening section 411 of the snap fastening portion 41 in the vertical direction (Z). The outboard axle 441 has an outboard axle shaft 443 rotatably journalled to the outboard pivot hole 321. The inboard axle 442 has an inboard axle shaft 444 rotatably journalled to the inboard pivot hole 331. The inboard axle shaft 444 has a cutting surface 445 inclined forwardly and upwardly to be in contact with the chamfer 332 of the inboard wall plate 33 when the inboard axle 442 is moved over the chamfer 332, to permit the deformable arm 422 to be deformed. A pivot axis (L) is defined by the outboard axle 441 and the inboard axle 442 and is parallel to the second horizontal direction (Y). The junction lines 418 are aligned with each other and are spaced apart from the pivot axis (L) of the pivot portion 44 in the first horizontal direction (X) by a distance (D). The pivot axis (L) is interposed between the junction lines 418 and the back end 414. Through the pivot portion 44, the locking member 4 is rotated relative to the frame 3 about the pivot axis (L) between a locking position (as shown in FIG. 9), where the snap fastening portion 41 is retained on the neck 22 of the positioning post 2, and an unlocking position (as shown in FIG. 11), where the snap fastening portion 41 is disengaged from the neck 22.

The unlocking operated portion 45 is in the form of a plate, and is connected with upper portions of the pivot portion 44 and the connecting section 412 and located above the flexible portion 43. The unlocking operated portion 45 is accommodated in the window 313 of the frame 3, and is operated to rotate the locking member 4 from the locking position to the unlocking position to disengage the snap fastening portion 41 from the neck 22. The unlocking operated portion 45 has a connecting end 451 which is connected with the outboard axle 441 and the inboard axle 442 of the pivot portion 44 and disposed distal from the front end 312 of the frame 3, an operated end 452 which is opposite to the connecting end 451 and proximal to the front end 312, and an operated bottom surface 453 which is connected with a lower portion of the operated end 452 for manual operation.

Figure 4:
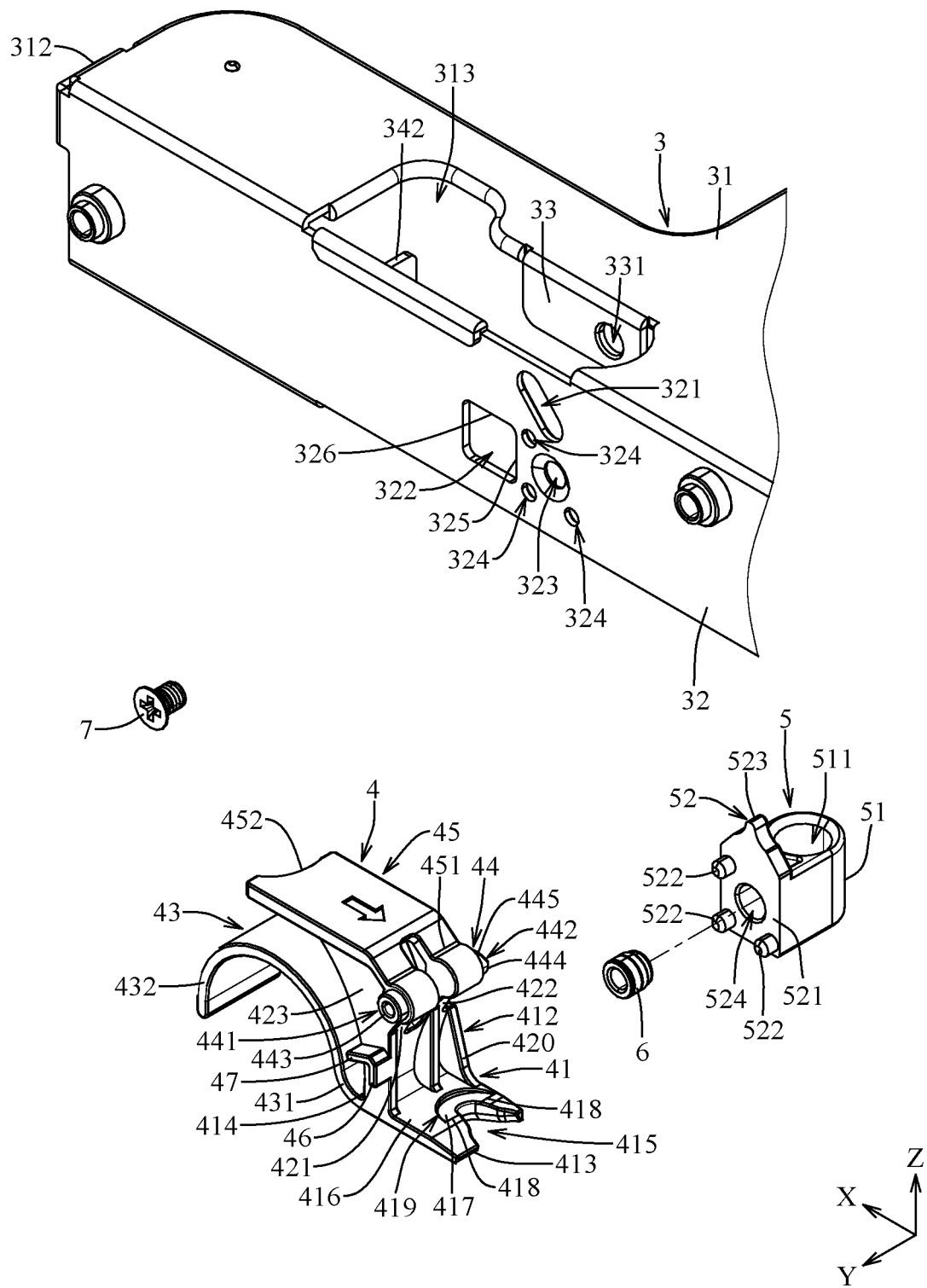
FIG. 4 is a fragmentary exploded perspective view of the locking mechanism.
Figure 5:
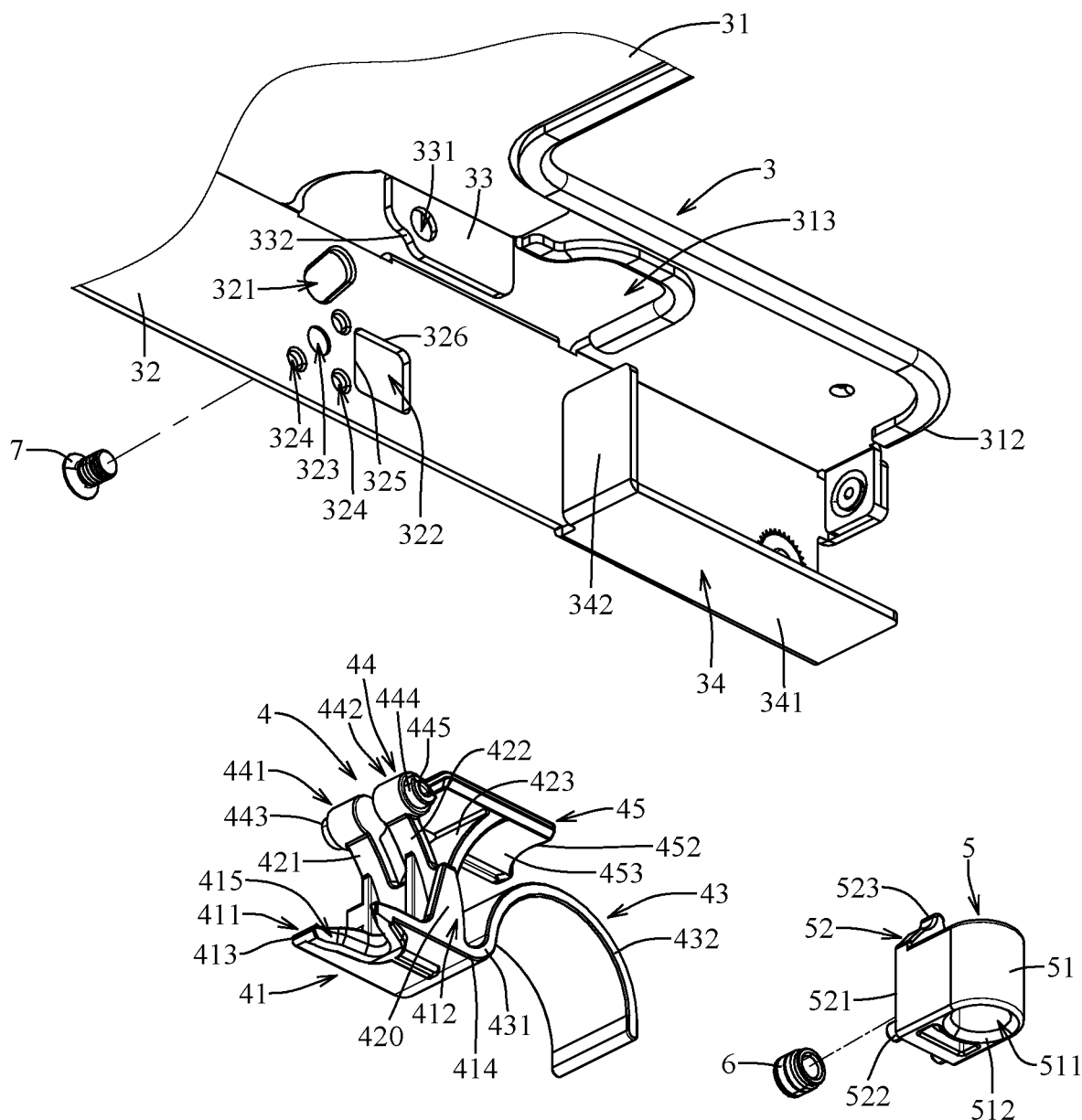
FIG. 5 is a fragmentary exploded perspective view similar to FIG. 4 but taken from another angle.

With reference to FIGS. 2 and 4, the first retaining protrusion 46 projects from a left side of the connecting bracket 420 of the snap fastening portion 41 and extends uprightly to be accommodated in the abutting hole 322 of the frame 3 to be in abutting engagement with the first abutting edge 325 (see FIG. 10) when the locking member 4 is rotated to the locking position to prevent further rotation thereof. The second retaining protrusion 47 projects from the left side of the connecting bracket 420 of the snap fastening portion 41 and is in the form of an inclined plate. The second retaining protrusion 47 intersects the first retaining protrusion 46 to define an acute angle therebetween. The second retaining protrusion 47 is accommodated in the abutting hole 322 of the frame 3 to be in abutting engagement with the second abutting edge 326 (see FIG. 12) when the locking member 4 is rotated to the unlocking position to prevent further rotation thereof.

With reference to FIGS. 2 to 5, the sleeve 5 is disposed inboard of the outboard wall plate 32 of the frame 3 and aligned with the window 313 to be sleeved around the head 21 of the positioning post 2. In this embodiment, the sleeve 5 is integrally formed as a single piece. Specifically, the sleeve 5 is a single piece made from a plastic material by injection molding which simplifies the manufacturing process, reduce manufacturing costs, and reduces the amount of component parts of the locking mechanism 140.

The sleeve 5 has a sleeve body 51 and a connecting block 52 formed on a side of the sleeve body 51. The sleeve body 51 has an aligning hole 511 extending in the vertical direction (Z) for insertion of the head 21 thereinto, and an inner taper end surface 512 at a bottom end of the aligning hole 511. The inner taper end surface 512 is in slidable contact with the outer taper end surface 211 of the head 21 for facilitating insertion of the head 21 into the aligning hole 511. The connecting block 52 has an abutting portion 521, a plurality of positioning protrusions 522 and a holding protrusion 523. The abutting portion 521 is connected with a left side of the sleeve body 51 for abutting on the inside surface of the outboard wall plate 32. The abutting portion 521 has a connecting hole 524 aligned with the through hole 323. The positioning protrusions 522 project from the abutting portion 521 and are arranged around the connecting hole 524 to be respectively inserted into the positioning holes 324. The holding protrusion 523 projects and is tapered from an upper end of the abutting portion 521 to bear the inboard axle 442 of the locking member 4 and prevent movement of the outboard axle 441 relative to the outboard pivot hole 321.

The first screw 6, such as a female screw, is securely engaged in the connecting hole 524 of the sleeve 5 via heat welding. The second screw 7, such as a male screw, extends through the through hole 323 of the frame 3 and is threadedly engaged with the first screw 6 so as to fasten the sleeve 5 to the outboard wall plate 32.

With reference to FIGS. 2, 3, 5 and 7, when it is desired to mount the locking member 4 and the sleeve 5 on the frame 3, the outboard axle shaft 443 of the outboard axle 441 is aligned with the outboard pivot hole 321 of the frame 3 to have the locking member 4 be tilted at an appropriate angle, and is inserted into the outboard pivot hole 321. Then, the inboard axle 442 is turned toward the chamfer 332 of the inboard wall plate 33 to make the locking member 4 horizontal. With the cutting surface 445 of the inboard axle 442 in contact with and positioned over the chamfer 332, the deformable arm 422 is bent toward the support arm 421. Deformation of the deformable arm 422 stores a biasing restoring force such that the inboard axle shaft 444 is moved to a side of the inboard wall plate 33 facing the outboard wall plate 32. When the inboard axle shaft 444 is moved to align with the inboard pivot hole 331, through the biasing restoring force of the deformable arm 422, the inboard axle shaft 444 is engaged in the inboard pivot hole 331. At this stage, the outboard axle shaft 443 is disposed on an upper end portion of the outboard pivot hole 321. The unlocking operated portion 45 is exposed from the window 313. The free end (front end) of the flexible arm 432 abuts against the upright plate portion 342 of the abutting wall plate 34.

With reference to FIGS. 2, 4, 6 and 7, the positioning protrusions 522 of the sleeve 5 are respectively aligned with and inserted into the positioning holes 324 of the outboard wall plate 32 to keep the sleeve 5 on the outboard wall plate 32. At this stage, the sleeve 5 is located above the snap fastening section 411 of the locking member 4. The aligning hole 511 is aligned with and exposed from the window 313, and is aligned with the fastening notch 415 and the semi-circular shaped inclined recess 419 of the locking member 4. Also, the holding protrusion 523 bears the inboard axle 442 to prevent movement of the outboard axle shaft 443 relative to the outboard pivot hole 321. Finally, the second screw 7 extends through the through hole 323 of the outboard wall plate 32 and is threadedly engaged with the first screw 6 on the sleeve 5 so as to complete the process for mounting the locking member 4 and the sleeve 5 on the frame 3. Since the locking mechanism 140 has a few of component parts, the assembly thereof is simple and convenient to conduct, and has a simple and compact construction to reduce the manufacturing costs.

Figure 6:
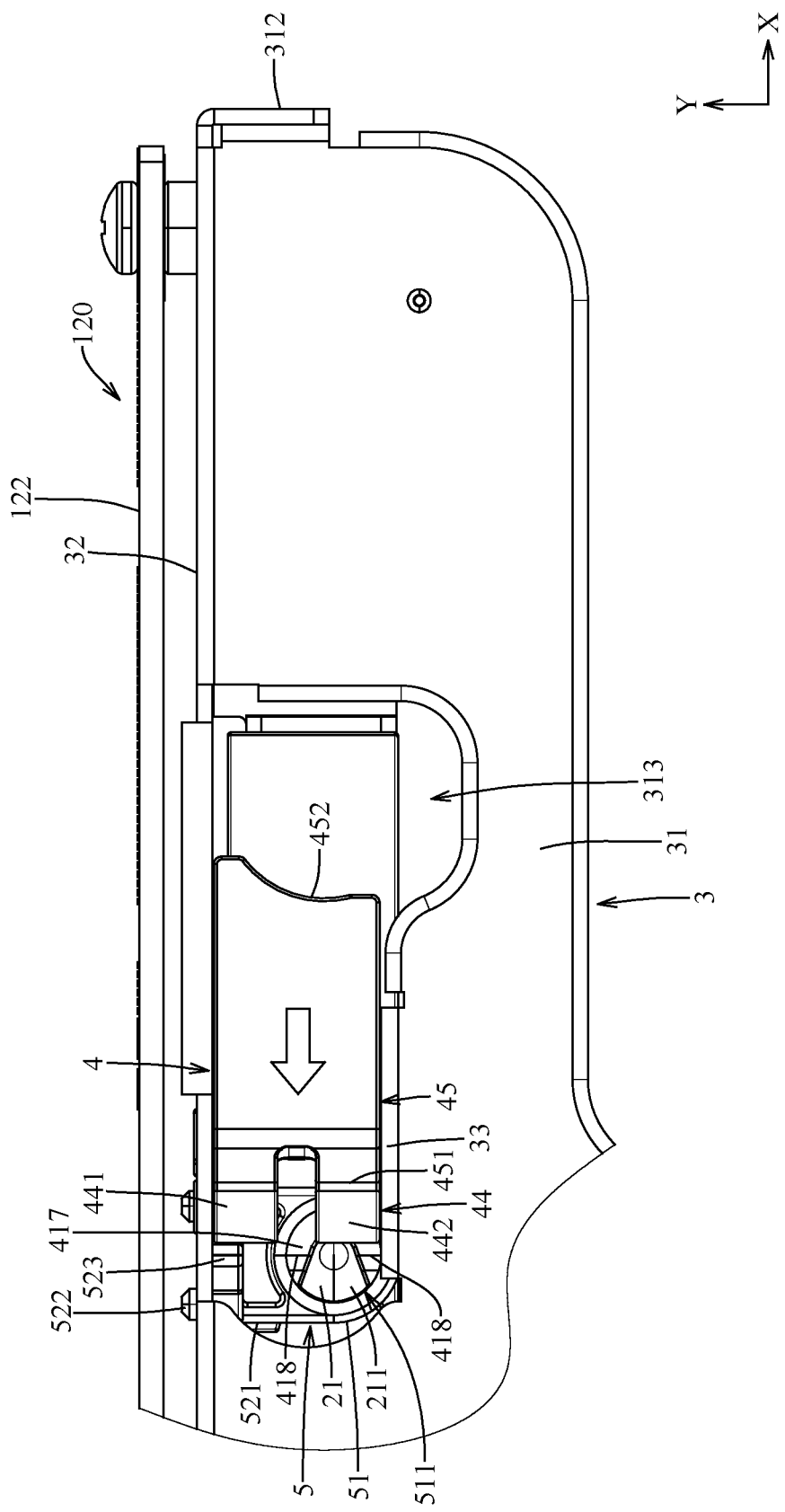
FIG. 6 is a fragmentary top view of the embodiment.
Figure 7:
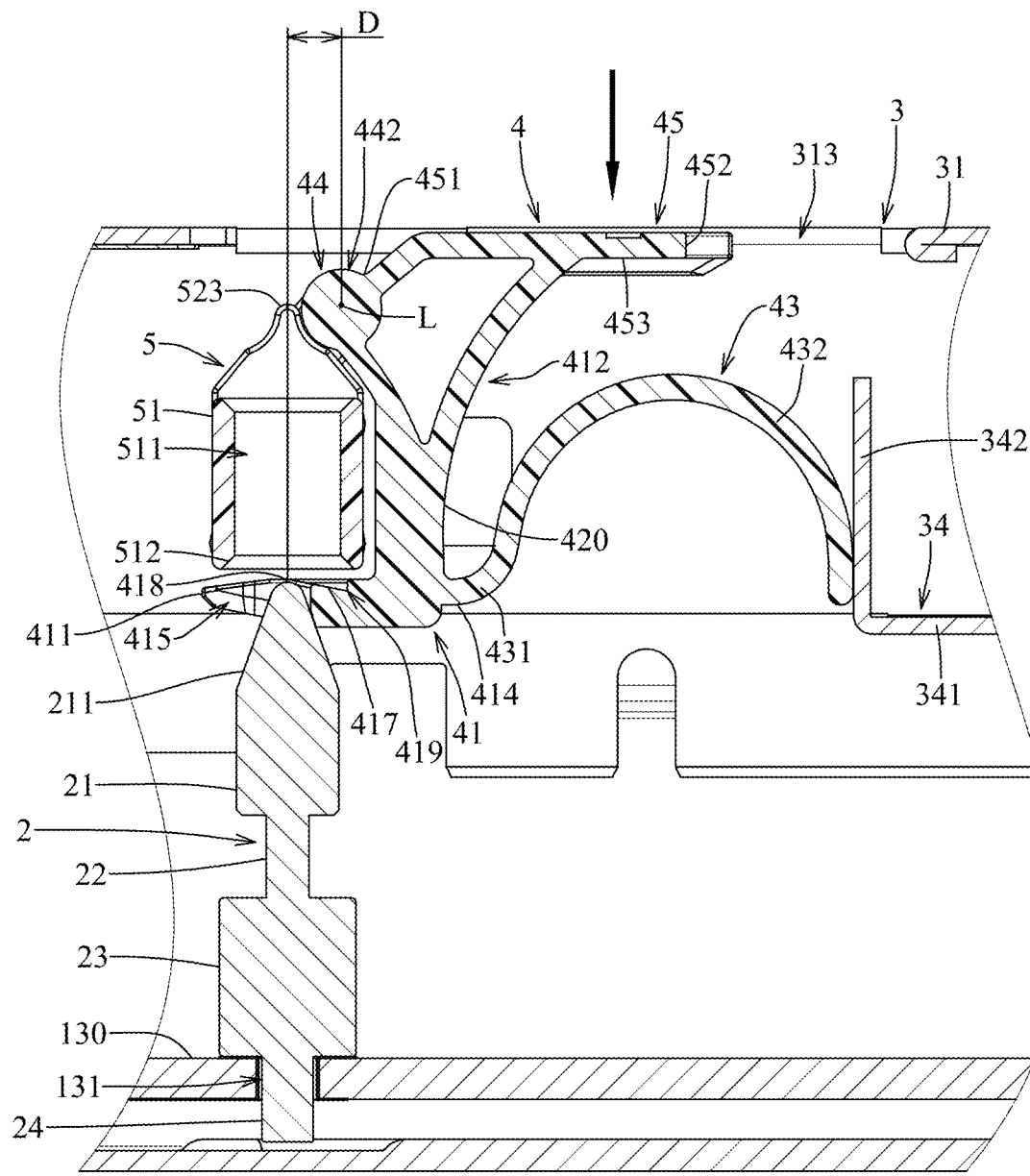
FIG. 7 is a fragmentary sectional view illustrating the locking mechanism during assembling.

With reference to FIGS. 6 and 7, when it is desired to lock the first electrical component 120 to the second electrical component 130, a user can observe the aligning hole 511 of the sleeve 5 from the window 313 of the frame 3, and move the sleeve 5 above the positioning post 2 to align the aligning hole 511 with the head 21 of the positioning post 2.

Figure 8:
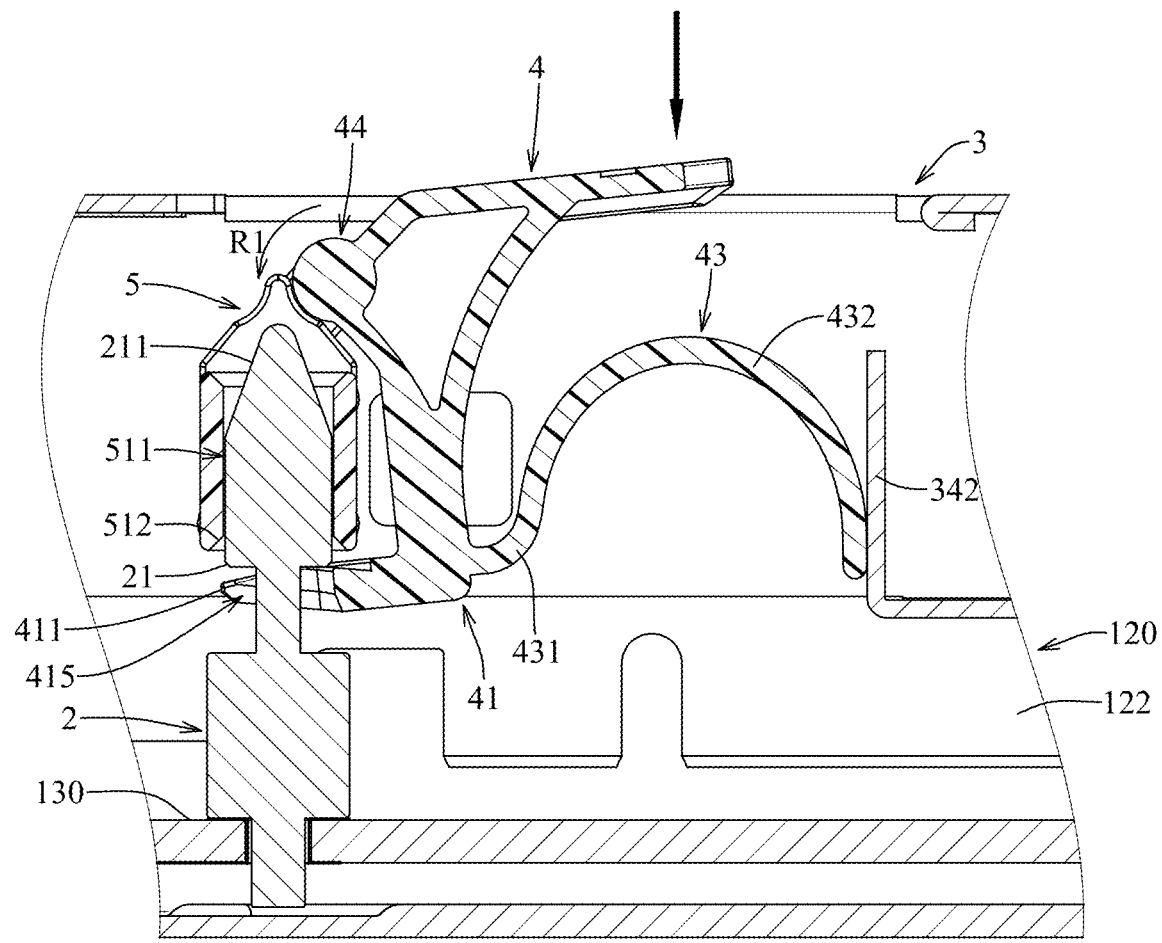
FIG. 8 is a fragmentary sectional view illustrating the locking mechanism during assembling.
Figure 8:
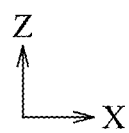

With reference to FIGS. 7 and 8, subsequently, the frame 3 is moved downwardly. During the downward movement of the frame 3, the head 21 of the positioning post 2 is firstly inserted into the fastening notch 415 of the snap fastening section 411 and the peripheral area of the fastening notch 415 contacts the outer taper end surface 211 of the head 21. Thereby, a lateral thrust force exerted by the head against the snap fastening section 411 deformably spreads the snap fastening section 411, and the locking member 4 is rotated relative to the frame 3 about the pivot axis (L) of the pivot portion 44 in a first rotational direction (R1). With the flexible arm 432 of the flexible portion 43 abutting against the upright plate portion 342 of the abutting wall plate 34, and the connecting arm 431 integrally connected with the back end 414, during the rotation of the locking member 4 in the first rotational direction (R1), the lateral thrust force is transmitted through the snap fastening section 411 to the flexible portion 43, which results in deformation of the flexible portion 43 which stores a biasing restoring.

Subsequently, the head 21 is inserted into the aligning hole 511 of the sleeve 5. During this process, the inner taper end surface 512 of the sleeve 5 is in slidable contact with the outer taper end surface 211 of the head 21 for facilitating insertion of the head 21 into the aligning hole 511, and for regulating and centering the position of the sleeve 5 relative to the positioning post 2. When the peripheral area of the fastening notch 415 of the snap fastening section 411 is removed from the outer taper end surface 211 of the head 21, the rotation of the locking member 4 stops, and the frame 3, the locking member 4 and the sleeve 5 may be moved downwardly relative to the positioning post 2.

Figure 10:
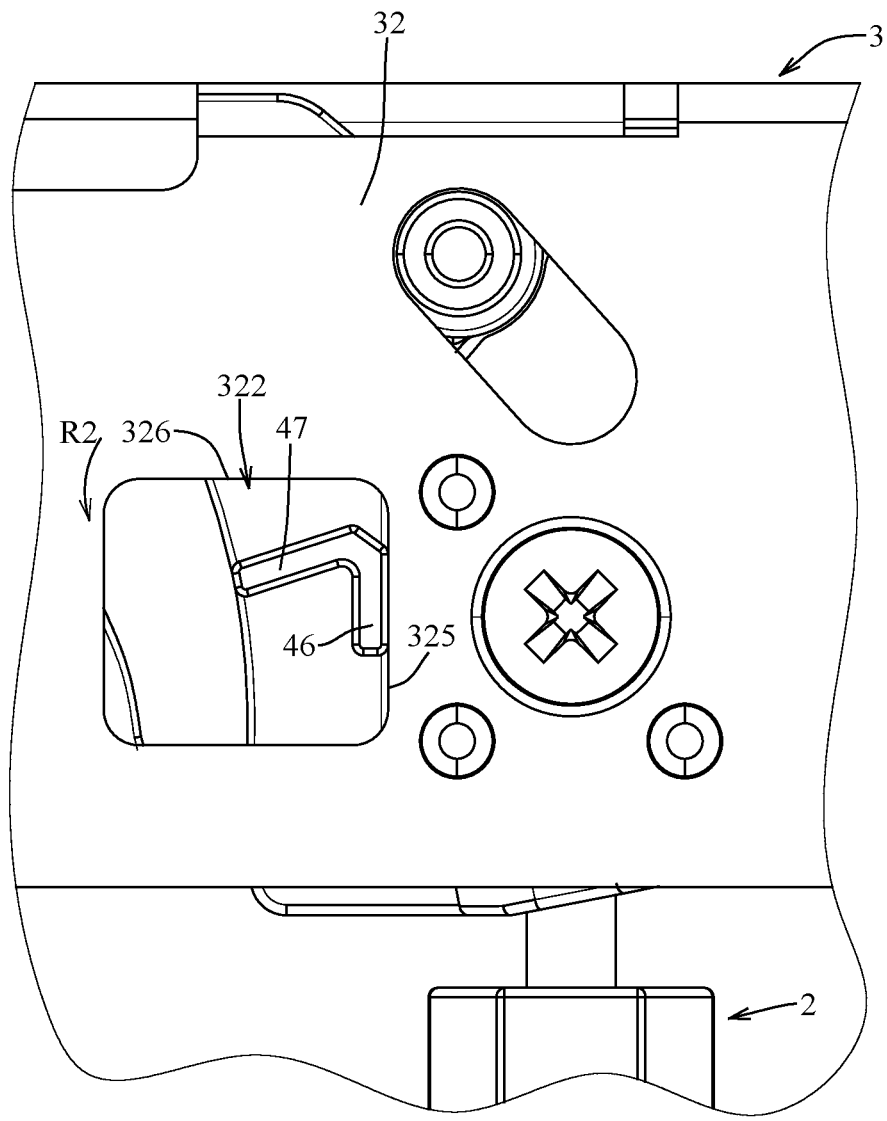
FIG. 10 is a fragmentary side view illustrating a state where a first retaining protrusion of the locking member is in abutting engagement with a first abutting edge of a frame.

With reference to FIGS. 8, 9 and 10, when the peripheral area of the fastening notch 415 of the snap fastening section 411 is separated from the head 21, the biasing restoring force of the flexible arm 432 is released and transmitted through the connecting arm 431 to rotate the locking member 4 about the pivot axis (L) of the pivot portion 44 relative to the frame 3 in a second rotational direction (R2) opposite to the first rotational direction (R1). At the same time, the circuit board 122 of the first electrical component 120 is connected with an electrical connector of the second electrical component 130. When the first retaining protrusion 46 is in abutting engagement with the first abutting edge 325 of the outboard wall plate 32, the locking member 4 is retained in the locking position, where the fastening notch 415 is engaged with the neck 22 of the positioning post 2 to prevent further rotation of the locking member 4 so as to lock the first electrical component 120 to the second electrical component 130.

With the connecting arm 431 of the locking member 4 integrally connected with the back end 414 of the snap fastening section 411, the biasing restoring force stored on the flexible arm 432 is directly transmitted through the connecting arm 431 to cause the snap fastening section 411 to rebound and reduce force dissipation. Thus the locking member 4 is returned rapidly and retained to the locking position. Moreover, with the flexible arm 432 of the locking member 4 having an upward convex cross-section not to project beyond a bottom end of the outboard wall plate 32 of the frame 3, interference of the flexible arm 432 with the second electrical component 130 during the locking operation of the locking mechanism 140 for locking the first electrical component 120 to the second electrical component 130 is prevented. Furthermore, with the connecting arm 431 of the flexible portion 43 bending upwardly from the back end 414 and extending annularly, stress concentration during the deformation of the flexible arm 432 is prevented so as to avoid cracking between the flexible arm 432 and the connecting arm 431.

With the inner taper end surface 512 of the sleeve 5 in slidable contact with the outer taper end surface 211 of the head 21 of the positioning post 2, a horizontal deflection of the frame 3 on the plane confined by the first horizontal direction (X) and the second horizontal direction (Y) during a downward movement of the frame 3 is regulated. Also, the aligning hole 511 is aligned with the fastening notch 415 of the locking member 4 and is exposed from the window 313 of the frame 3. The user can observe the aligning hole 511 from the window 313, move the sleeve 5 above the positioning post 2 to align the aligning hole 511 with the head 21, and move the frame 3 downwardly. The fastening notch 415 of the snap fastening section 411 is smoothly retained on the neck 22 of the positioning post 2. With the sleeve 5, the assembly operation of the locking mechanism is convenient to conduct.

With the snap fastening section 411 retained on the neck 22, the locking member 4 is retained firmly to not sway in the first and second horizontal directions. Also, with the insertion engagement of the head 21 in the aligning hole 511, swaying of the sleeve 5 on a plane parallel to the first horizontal direction (X) and the second horizontal direction (Y) is prevented. Thus, when the locking member 4 is in the locking position, swaying of the first electrical component 120 on a horizontal plane is prevented.

Figure 12:
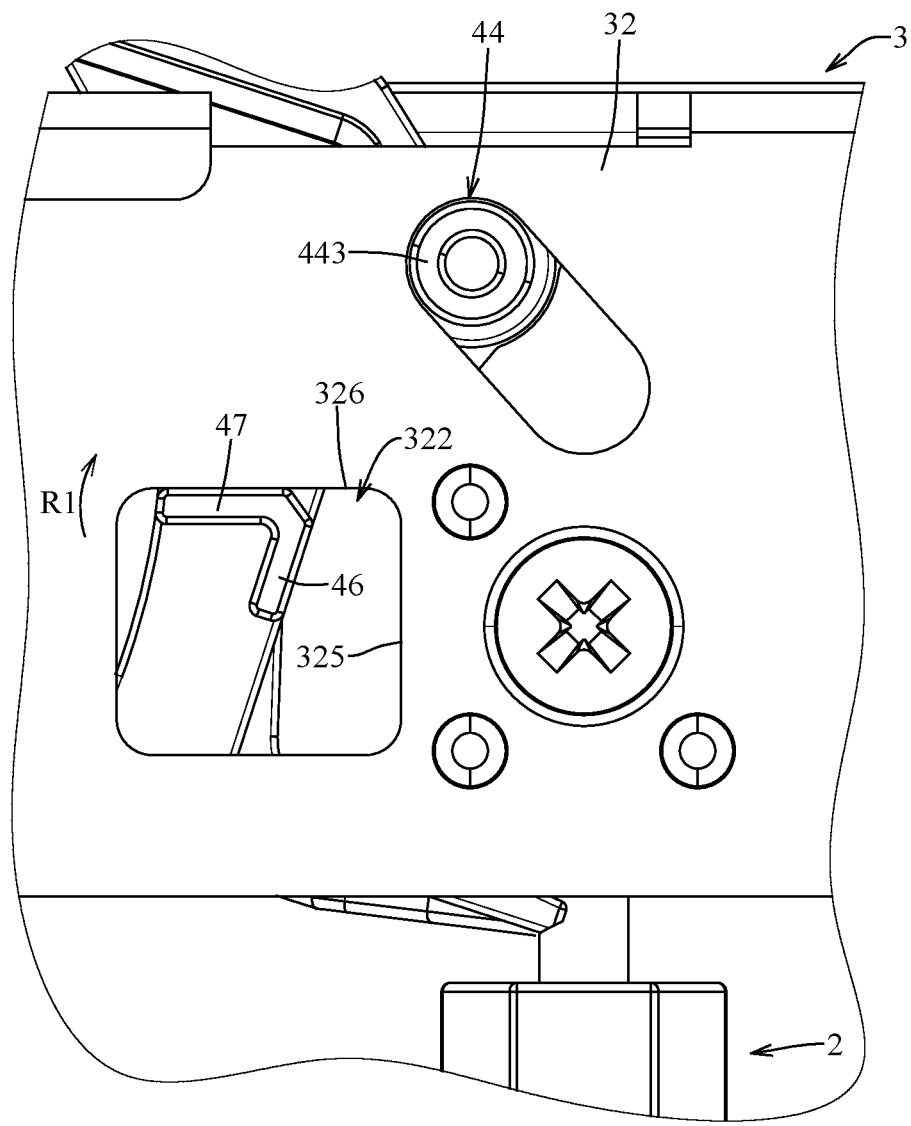
FIG. 12 is a fragmentary side view illustrating a state where a second retaining protrusion of the locking member is in abutting engagement with a second abutting edge of the frame.

With reference to FIGS. 11 and 12, when it is desired to remove the first electrical component 120 from the second electrical component 130, the user pulls upwardly the operated bottom surface 453 of the unlocking operated portion 45 with his/her finger through the window 313, to rotate the locking member 4 in the first rotational direction (R1) relative to the frame 3. During the rotation of the locking member 4, the fastening notch 415 is moved gradually away from the neck 22, and the snap fastening section 411 applies a lateral thrust force to the flexible portion 43 to bend the flexible arm 432 and store a biasing restoring force. When the second retaining protrusion 47 is in abutting engagement with the second abutting edge 326 of the outboard wall plate 32, the locking member 4 is retained in the unlocking position, where the fastening notch 415 is disengaged from the neck 22 to prevent further rotation of the locking member 4.

Figure 13:
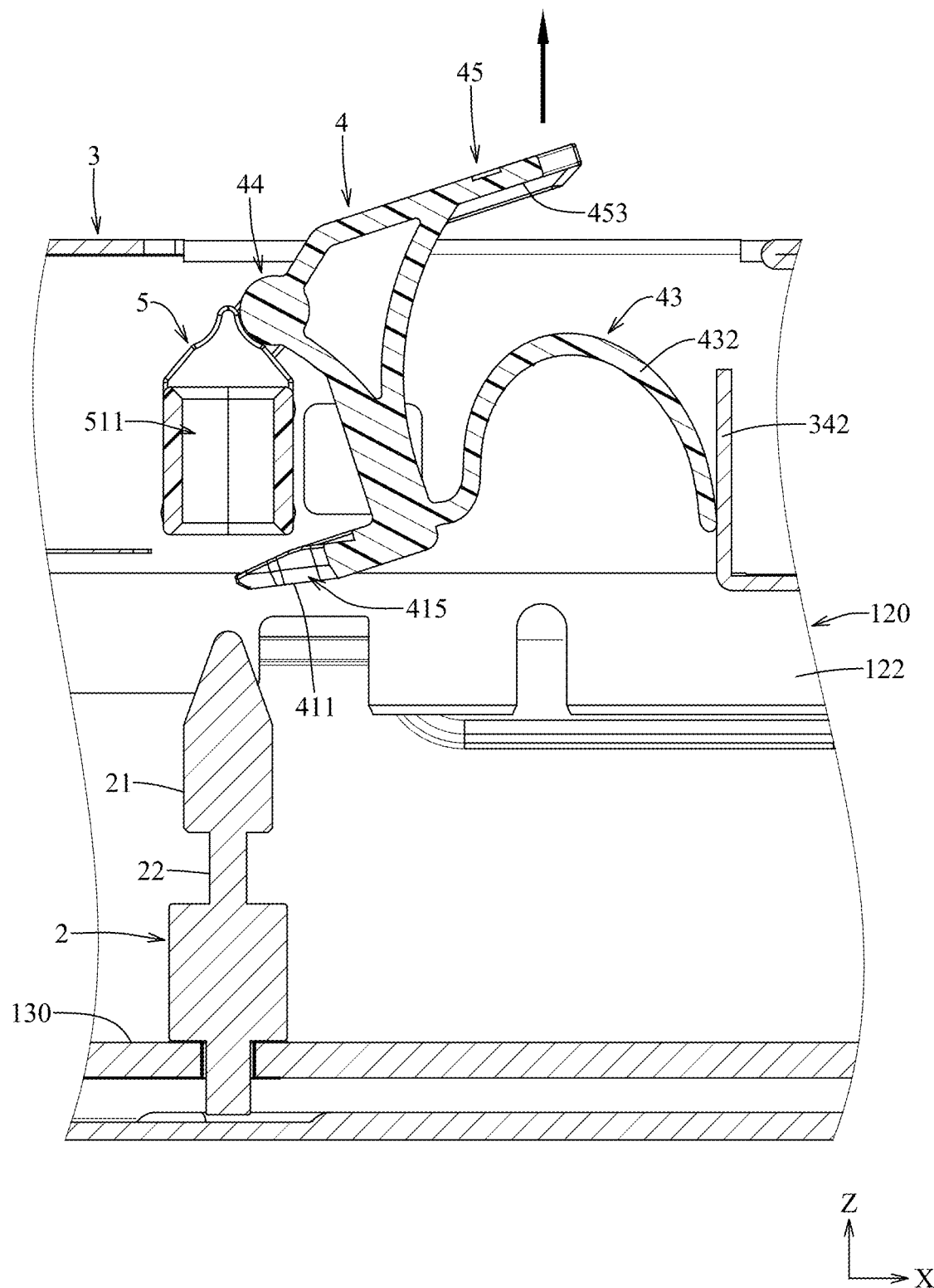
FIG. 13 is a fragmentary sectional view illustrating the locking mechanism during disassembling.

With reference to FIGS. 12 and 13, subsequently, the locking member 4 is moved upwardly by a pulling force applied to the operated bottom surface 453 of the unlocking operated portion 45. The frame 3 is raised to bring the first electrical component 120 to move upwardly and to permit removal of the circuit board 122 from the electrical connector of the second electrical component 130.

Since a pulling force is applied to the operated bottom surface 453 of the unlocking operated portion 45 during the unlocking and removing operation, the disassembling operation is only a single step and is convenient to conduct, which enhances the operation efficiency. Further, the pulling force applied to the operated bottom surface 453 is transmitted through both the pivot portion 44 and the second retaining protrusion 47 to the frame 3 so as to be evenly applied to the frame 3. The frame 3 thus can smoothly bring the first electrical component 120 to move upwardly and be removed from the second electrical component 130.

Figure 14:
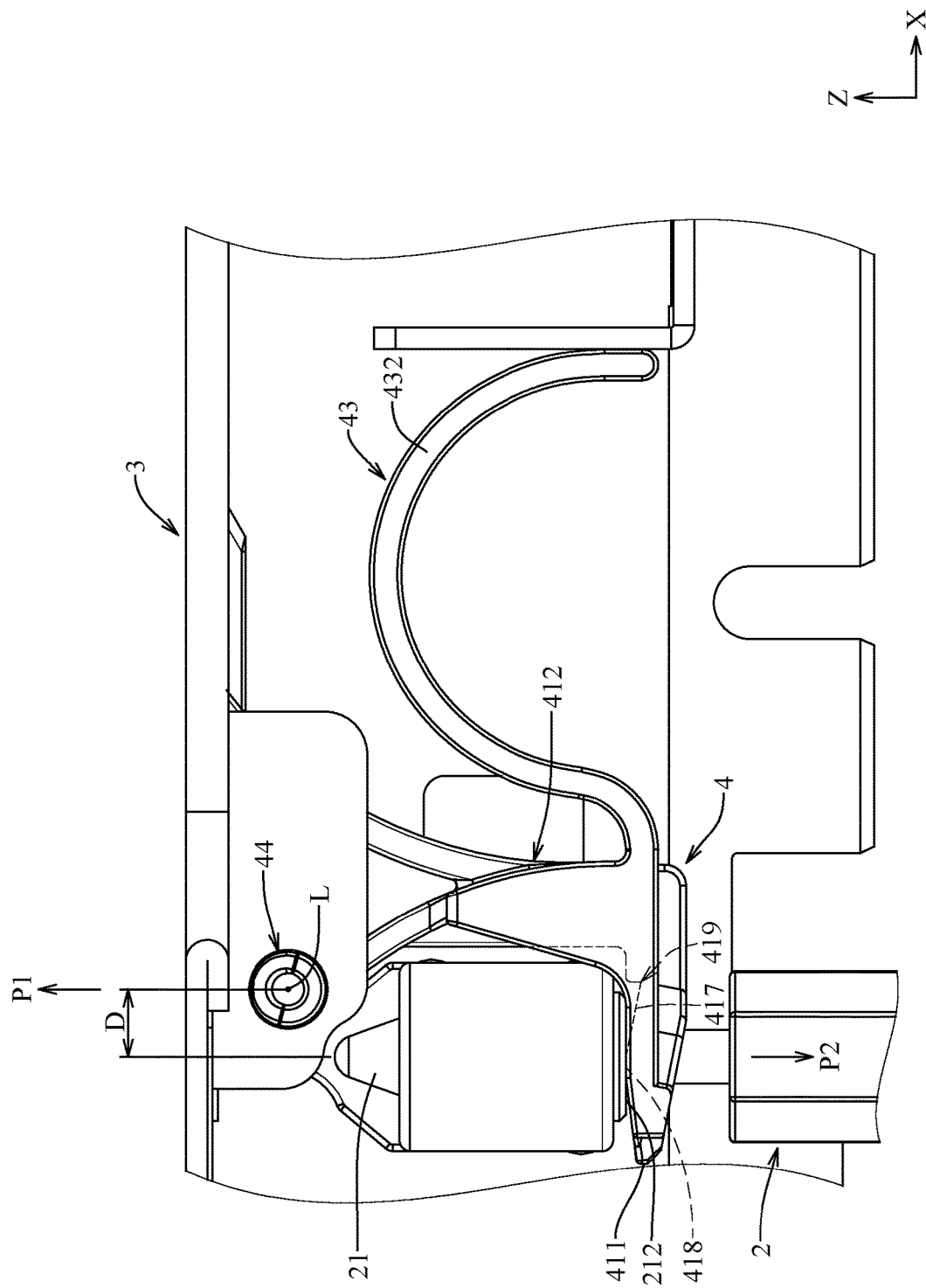
FIG. 14 is a fragmentary side view of the embodiment.
Figure 15:
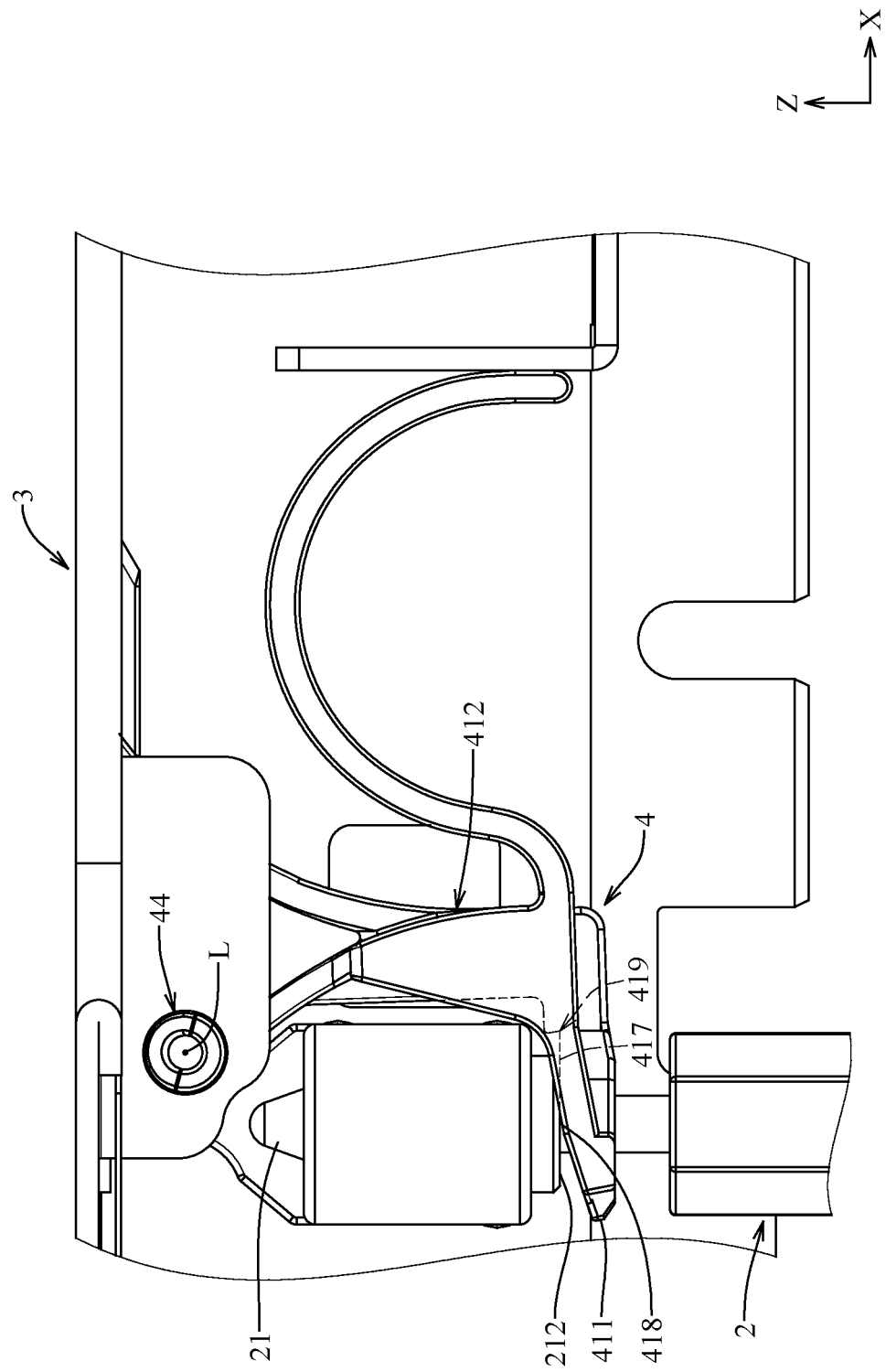
FIG. 15 is a fragmentary side view of the embodiment.

With reference to FIGS. 14 and 15, once the frame 3 is subjected to an external upward force (P1) in the vertical direction (Z), the pivot portion 44 of the locking member 4 might be moved upwardly. Since the pivot axis (L) of the pivot portion 44 is spaced apart from the junction lines 418 of the snap fastening portion 41 in the first horizontal direction (X) by a distance (D), a torque in the same direction as the first rotational direction (R1) (as shown in FIG. 11) is generated when the external upward force (P1) is transmitted through the pivot axis (L) of the pivot portion 44, which brings the junction lines 418 to tightly press and contact the annular lower surface 212 of the head 21 of the positioning post 2 such that a counteracting force (P2) opposite to the external upward force (P1) is generated by the annular lower surface 212 to slightly bend the connecting section 412. As such, the junction lines 418 are moved toward an outer periphery of the annular lower surface 212, and the peripheral slope surface 417 is turned toward the annular lower surface 212. When the peripheral slope surface 417 is turned to be in a horizontal state and in surface contact engagement with the annular lower surface 212, the peripheral slope surface 417 is retained by the annular lower surface 212 to stay still such that the fastening notch 415 of the locking member 4 is still retained on the neck 22 of the positioning post 2 to not be disengaged from the neck 22. Hence, even when an external force is applied to the locking member 4, such as when the device is dropped or an external force (P1) is generated as a result of improper operation, the locking position of the locking member 4 is still maintained steadily.

In a modified form of the embodiment of the locking mechanism 140, the sleeve 5, the first screw 6 and the second screw 7 may be dispensed with.

In another modified form of the embodiment of the locking mechanism 140, the flexible portion 43 may be formed as a single piece which is securely connected with the back end 414 of the snap fastening section 411 in any appropriate joining manner. Additionally, the flexible portion 43 may be in the form of a compression spring or a torsion spring.

As illustrated, since the locking mechanism 140 has a few of component parts, the assembly thereof is simple and convenient to conduct, and has a simple and compact construction to reduce the manufacturing costs. With the locking member 4 and the sleeve 5, the assembly and locking operations are convenient to perform to enhance the operation efficiency. Through a pulling force applied to the operated bottom surface 453 of the unlocking operated portion 45 during the unlocking and removing operation, the disassembling operation has only one step and is convenient to conduct, which enhances the operation efficiency.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A locking mechanism for removably locking a first electrical component to a second electrical component, comprising:

a positioning post having a mounting end securely mountable on the second electrical component, a head opposite to said mounting end, and a neck between said mounting end and said head and connected with said head;

a frame for the first electrical component to be disposed thereon; and a locking member movably connected with said frame, said locking member having a snap fastening portion and a flexible portion opposite to each other, and an unlocking operated portion, said snap fastening portion being configured such that, when said snap fastening portion contacts said head and is moved toward said neck, a lateral thrust force exerted by said head deformably spreads said snap fastening portion, which results in deformation of said flexible portion to store a biasing restoring force, said flexible portion being configured such that, when said snap fastening portion is moved to align with said neck, said snap fastening portion is moved by the biasing restoring force to be snap fastened to said neck, said unlocking operated portion being operated to disengage said snap fastening portion from said neck.

2. The locking mechanism of claim 1, wherein said snap fastening portion has a snap fastening section which is formed with a fastening notch extending from an end edge thereof to be retained on said neck.

3. The locking mechanism of claim 2, wherein said snap fastening section has a back end opposite to said end edge, said flexible portion being integrally formed and connected with said back end.

4. The locking mechanism of claim 1, wherein said flexible portion has a flexible arm which has an upward convex cross-section and which has a free end abutting against said frame.

5. The locking mechanism of claim 1, wherein said snap fastening portion has a snap fastening section to be retained on said neck, said snap fastening section having a back end, said flexible portion having a connecting arm which extends arcuately and upwardly from said back end, and a flexible arm which is connected with and extends from said connecting arm away from said back end to terminate at a free end for abutting against said frame.

6. The locking mechanism of claim 1, wherein said head has an annular lower surface, said locking member further having a pivot portion which is rotatably pivoted to said frame about a pivot axis, said snap fastening portion having a snap fastening section which extends from an end edge thereof and which is disposed below said pivot portion, said snap fastening section being formed with a fastening notch to be retained on said neck, said snap fastening section having a peripheral slope surface which extends around said fastening notch and which is in surface contact engagement with said annular lower surface.

7. The locking mechanism of claim 6, wherein said snap fastening section has a back end opposite to said end edge, and a flat upper surface which is interposed between said back end and said fastening notch, said peripheral slope surface extending and being inclined downwardly from said flat upper surface toward said back end and having two junction lines which are connected with said flat upper surface and located at two opposite sides of said fastening notch, respectively, said junction lines being aligned with each other and being spaced apart from said pivot axis of said pivot portion in a horizontal direction, said pivot axis being interposed between said junction lines and said back end.

8. The locking mechanism of claim 7, wherein said flat upper surface of said snap fastening section has a semicircular shaped inclined recess which is recessed from said flat upper surface and inclined downwardly toward said back end and in communication with said fastening notch for accommodating a portion of said head, said peripheral slope surface being of a semicircular shape to border a bottom of said semicircular shaped inclined recess.

9. The locking mechanism of claim 1, wherein said frame has a front end, said locking member further having a pivot portion which is rotatably pivoted to said frame, said unlocking operated portion having a connecting end which is connected with said pivot portion and disposed distal from said front end, an operated end which is opposite to said connecting end and proximal to said front end, and an operated bottom surface which is connected with a lower portion of said operated end.

10. The locking mechanism of claim 1, wherein said locking member is rotatably pivoted to said frame and is rotated relative to said frame about a pivot axis between a locking position, where said snap fastening portion is retained on said neck, and an unlocking position, where said snap fastening portion is disengaged from said neck, said locking member further having a first retaining protrusion and a second retaining protrusion, said frame having a first abutting edge which is disposed to permit abutting engagement of said first retaining protrusion therewith when said locking member is rotated to the locking position to prevent further rotation thereof, and a second abutting edge which is disposed to permit abutting engagement of said second retaining protrusion therewith when said locking member is rotated to the unlocking position to prevent further rotation thereof.

11. The locking mechanism of claim 1, wherein said frame has an outboard wall plate formed with an outboard pivot hole, and an inboard wall plate disposed inboard of said outboard wall plate and formed with an inboard pivot hole, said outboard pivot hole being in form of an elongated inclined hole, said locking member further having an outboard axle rotatably journalled to said outboard pivot hole, and an inboard axle rotatably journalled to said inboard pivot hole.

12. The locking mechanism of claim 11, wherein said inboard wall plate has a chamfer formed near said inboard pivot hole, said snap fastening portion of said locking member having a deformable arm which is connected with said inboard axle at a distal end thereof, said inboard axle having a cutting surface which is in contact with said chamfer when said inboard axle is moved over said chamfer, to permit said deformable arm to be deformed.

13. The locking mechanism of claim 11, further comprising a sleeve which is disposed inboard of said outboard wall plate to be sleeved around said head, said sleeve having a holding protrusion which bears said inboard axle to prevent movement of said outboard axle relative to said outboard pivot hole.

14. The locking mechanism of claim 1, wherein said locking member is integrally formed as a single piece.

15. The locking mechanism of claim 1, further comprising a sleeve which is disposed on said frame, said sleeve having an aligning hole for insertion of said head thereinto.

16. The locking mechanism of claim 15, wherein said frame has a top wall plate, said top wall plate having a window such that said aligning hole and said unlocking operated portion are exposed from said window.

17. The locking mechanism of claim 15, wherein said head has an outer taper end surface, said sleeve having an inner taper end surface at a bottom end of said aligning hole, said inner taper end surface being in slidably contact with said outer taper end surface for facilitating insertion of said head into said aligning hole.

18. The locking mechanism of claim 15, wherein said sleeve is integrally formed as a single piece.

19. An electronic device, comprising a first electrical component, a second electrical component, and a locking mechanism as claimed in claim 1.

* * * * *